(12) United States Patent
Happ et al.

(10) Patent No.: US 8,384,062 B2
(45) Date of Patent: Feb. 26, 2013

(54) MEMORY INCLUDING VERTICAL BIPOLAR SELECT DEVICE AND RESISTIVE MEMORY ELEMENT

(75) Inventors: Thomas Happ, Tarrytown, NY (US); Jan Boris Philipp, Peekskill, NY (US)

(73) Assignee: Qimonda AG, Munich (DE)

( * ) Notice: Subject to any disclaimer, the term of this patent is extended or adjusted under 35 U.S.C. 154(b) by 294 days.

(21) Appl. No.: 12/853,791

(22) Filed: Aug. 10, 2010

(65) Prior Publication Data
US 2010/0321990 A1  Dec. 23, 2010

Related U.S. Application Data

(62) Division of application No. 11/701,198, filed on Feb. 1, 2007, now Pat. No. 7,800,093.

(51) Int. Cl.
*H01L 21/82* (2006.01)

(52) U.S. Cl. .................................. 257/5; 257/E45.002

(58) Field of Classification Search ............... 257/2–5, 257/187, E45.002
See application file for complete search history.

(56) References Cited

U.S. PATENT DOCUMENTS

| | | | | |
|---|---|---|---|---|
| 7,202,493 | B2 * | 4/2007 | Lung | 257/4 |
| 7,459,715 | B2 * | 12/2008 | Toda et al. | 257/2 |
| 7,642,125 | B2 * | 1/2010 | Lung et al. | 438/102 |
| 7,709,325 | B2 * | 5/2010 | Joseph et al. | 438/266 |
| 7,709,885 | B2 * | 5/2010 | Daley et al. | 257/329 |
| 2002/0168852 | A1 * | 11/2002 | Harshfield et al. | 438/650 |

* cited by examiner

*Primary Examiner* — Nathan Ha
(74) *Attorney, Agent, or Firm* — Murphy, Bilak & Homiller, PLLC

(57) ABSTRACT

A memory includes a first vertical bipolar select device including a first base and a first emitter, a first phase change element coupled to the first emitter, a second vertical bipolar select device including a second base and a second emitter, a second phase change element coupled to the second emitter, and a buried word line contacting the first base and the second base.

7 Claims, 14 Drawing Sheets

MEMORY INCLUDING VERTICAL BIPOLAR SELECT DEVICE AND RESISTIVE MEMORY ELEMENT

PRIORITY CLAIM

This application is a divisional of, and claims priority to, U.S. application Ser. No. 11/701,198 filed 1 Feb. 2007, the content of which application is incorporated herein by reference in its entirety.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of each memory cell. Increasing the density of a phase change memory increases the amount of data that can be stored within the memory while at the same time typically reducing the cost of the memory.

For these and other reasons, there is a need for the present invention.

SUMMARY

According to an embodiment of a memory, the memory includes a first vertical bipolar select device including a first base and a first emitter, a first phase change element coupled to the first emitter, a second vertical bipolar select device including a second base and a second emitter, a second phase change element coupled to the second emitter, and a buried word line contacting the first base and the second base.

According to an embodiment of a method for fabricating a memory cell, the method includes forming a vertical bipolar select device including a base and an emitter, forming a buried metallized word line contacting the base of the vertical bipolar select device, and forming a resistive memory element coupled to the emitter.

According to another embodiment of a method for fabricating a memory cell, the method includes forming a collector region, a base region, and an emitter portion for a vertical bipolar select device on a substrate and isolating the collector region and a first portion of the base region with isolation material. Metal is deposited over exposed portions of the emitter portion and the base region. The metal is recess etched to expose a second portion of the base region and sidewalls of the emitter portion. The metal is annealed to form salicide contacting sidewalls of the base region and a top of the emitter portion. The metal not forming salicide is selectively etched to form salicide word lines and a salicide layer on top of the emitter portion. The salicide layer on top of the emitter portion is etched to form a salicide contact. The emitter portion is etched to form an emitter region. A phase change memory element coupled to the salicide contact is fabricated.

According to yet another embodiment of a method for fabricating a memory cell, the method includes forming a collector region, a base region, and an emitter portion for a vertical bipolar select device on a substrate, protecting a top of the emitter portion with a protection material layer, and isolating the collector region and a first portion of the base region with isolation material. Metal is deposited over exposed portions of the protection material layer, the emitter portion, and the base region. The metal is recess etched to expose a second portion of the base region and sidewalls of the emitter portion and annealed to form salicide contacting sidewalls of the base region. The metal not forming salicide is selectively etched to form salicide word lines. The emitter portion is etched to form an emitter region and a phase change memory element coupled to the emitter region is fabricated.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
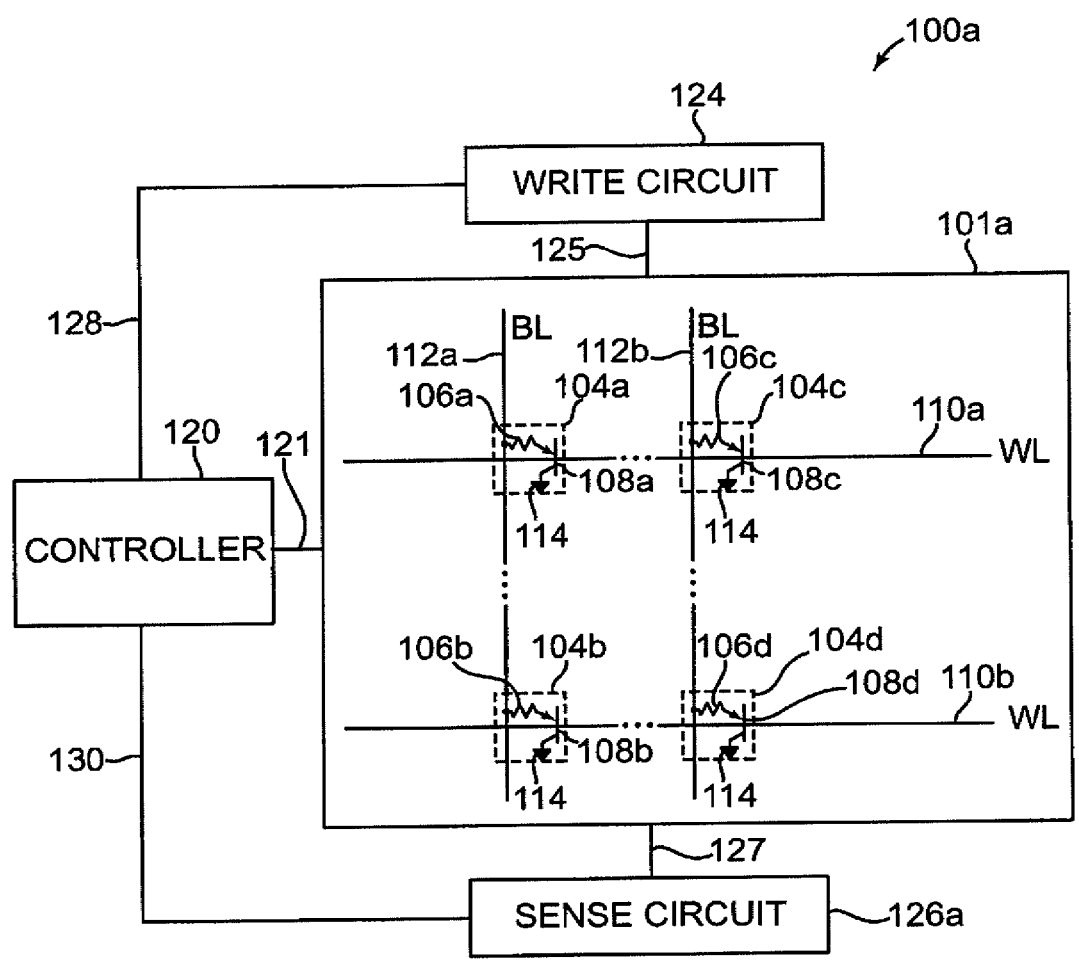
FIG. 1A is a diagram illustrating one embodiment of a memory device.

FIG. 1A is a diagram illustrating one embodiment of a memory device 100a. Memory device 100a includes write circuit 124, controller 120, memory array 101a, and sense circuit 126. Memory array 101a includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110). Each phase change memory cell 104a-104d includes a phase change element 106 and a bipolar transistor 108.

Each bipolar transistor 108 is a vertical pnp bipolar transistor or a vertical npn bipolar transistor. Each word line 110 includes a buried word line that contacts the base of each bipolar transistor along the word line. Each word line 110 is metallized and allows optimization of the base doping without constraints imposed by the word line series resistance. One word line contact is provided for every two or more phase change memory cells 104 to electrically couple a metal word line in an upper metallization layer to a buried word line. By providing only one contact to couple the metal word line to the buried word line for every two or more memory cells 104, the size of array of phase change memory cells 101a can be reduced compared to an array of phase change memory cells that includes one word line contact for each memory cell 104.

As used herein, the term "electrically coupled" is not meant to mean that the elements must be directly coupled together and intervening elements may be provided between the "electrically coupled" elements.

Memory array 101a is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a pnp bipolar transistor in the illustrated embodiment, in other embodiments, transistor 108 is an npn bipolar transistor. Phase change memory cell 104a includes phase change element 106a and transistor 108a. One side of phase change element 106a is electrically coupled to bit line 112a, and the other side of phase change element 106a is electrically coupled to the emitter of transistor 108a. The collector of transistor 108a is electrically coupled to common or ground 114. The base of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to the emitter of transistor 108b. The collector of transistor 108b is electrically coupled to common or ground 114. The base of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to the emitter of transistor 108c. The collector of transistor 108c is electrically coupled to common or ground 114. The base of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to the emitter of transistor 108d. The collector of transistor 108d is electrically coupled to common or ground 114. The base of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to the collector of transistor 108a. The emitter of transistor 108a is electrically coupled to bit line 112a.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100a. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100a. Controller 120 controls read and write operations of memory device 100a including the application of control and data signals to memory array 101a through write circuit 124 and sense circuit 126.

In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104*a*, a set current or voltage pulse is selectively enabled by write circuit 124 and sent through bit line 112*a* to phase change element 106*a* thereby heating phase change element 106*a* above its crystallization temperature (but usually below its melting temperature) with word line 110*a* selected to activate transistor 108*a*. In this way, phase change element 106*a* reaches its crystalline state or a partially crystalline and partially amorphous state during this set operation. During a reset operation of phase change memory cell 104*a*, a reset current or voltage pulse is selectively enabled by write circuit 124 and sent through bit line 112*a* to phase change element 106*a*. The reset current or voltage quickly heats phase change element 106*a* above its melting temperature. After the current or voltage pulse is turned off, phase change element 106*a* quickly quench cools into the amorphous state or a partially amorphous and partially crystalline state. Phase change memory cells 104*b*-104*d* and other phase change memory cells 104 in memory array 101*a* are set and reset similarly to phase change memory cell 104*a* using a similar current or voltage pulse.

Figure 1B:
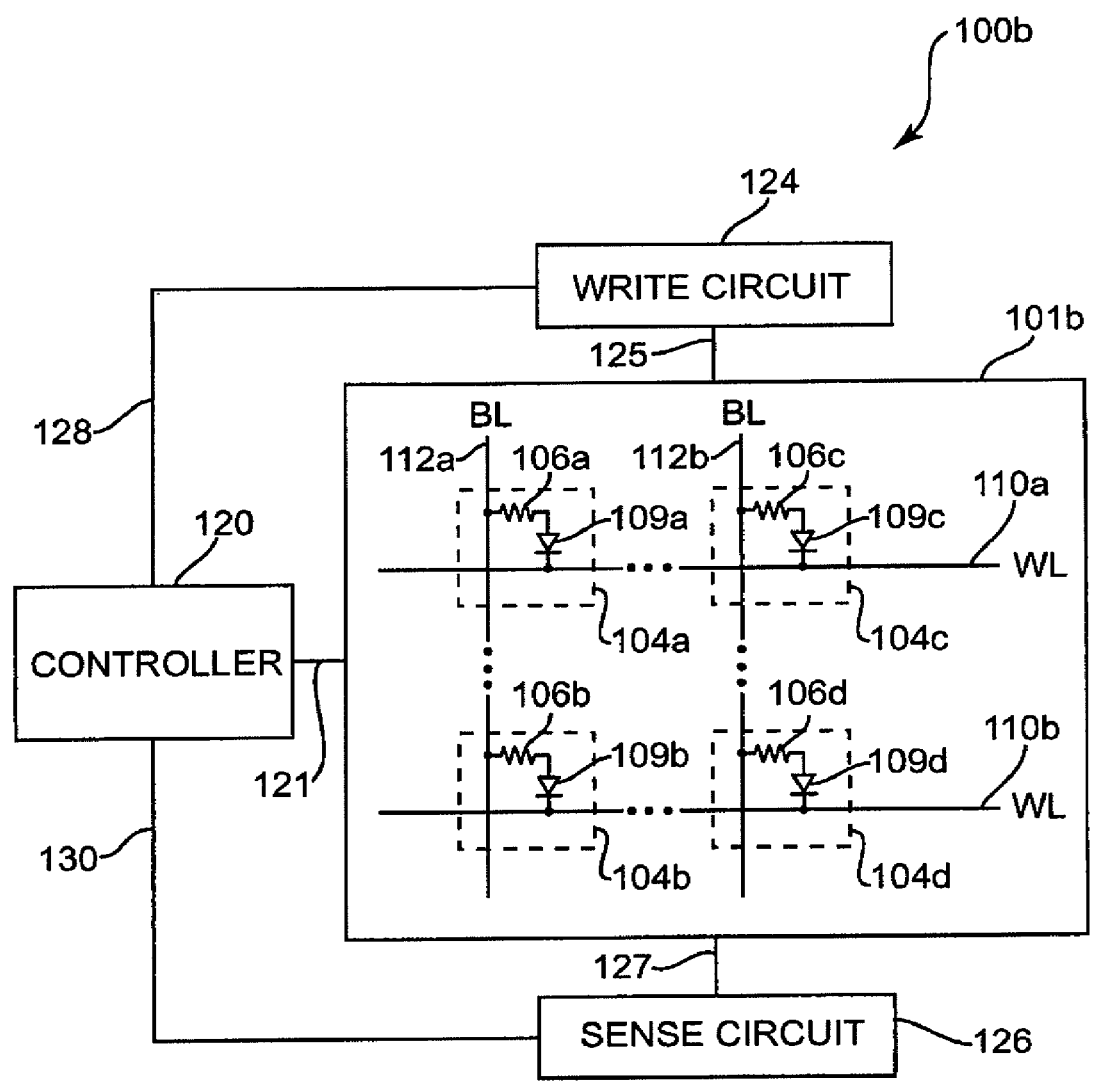
FIG. 1B is a diagram illustrating another embodiment of a memory device.

FIG. 1B is a diagram illustrating another embodiment of a memory device 100*b*. Memory device 100*b* is similar to memory device 100*a* previously described and illustrated with reference to FIG. 1A, except that in memory device 100*b* memory array 101*a* is replaced with memory array 101*b*. Memory array 101*b* is similar to memory array 101*a*, except that in memory array 101*b* transistors 108*a*-108*d* are replaced with diodes 109*a*-109*d*.

Each phase change memory cell 104 is electrically coupled to a word line 110 and a bit line 112. Phase change memory cell 104*a* is electrically coupled to bit line 112*a* and word line 110*a*, and phase change memory cell 104*b* is electrically coupled to bit line 112*a* and word line 110*b*. Phase change memory cell 104*c* is electrically coupled to bit line 112*b* and word line 110*a*, and phase change memory cell 104*d* is electrically coupled to bit line 112*b* and word line 110*b*.

Each phase change memory cell 104 includes a phase change element 106 and a diode 109. Phase change memory cell 104*a* includes phase change element 106*a* and diode 109*a*. One side of phase change element 106*a* is electrically coupled to bit line 112*a*, and the other side of phase change element 106*a* is electrically coupled to one side of diode 109*a*. The other side of diode 109*a* is electrically coupled to word line 110*a*.

Phase change memory cell 104*b* includes phase change element 106*b* and diode 109*b*. One side of phase change element 106*b* is electrically coupled to bit line 112*a*, and the other side of phase change element 106*b* is electrically coupled to one side of diode 109*b*. The other side of diode 109*b* is electrically coupled to word line 110*b*.

Phase change memory cell 104*c* includes phase change element 106*c* and diode 109*c*. One side of phase change element 106*c* is electrically coupled to bit line 112*b* and the other side of phase change element 106*c* is electrically coupled to one side of diode 109*c*. The other side of diode 109*c* is electrically coupled to word line 110*a*.

Phase change memory cell 104*d* includes phase change element 106*d* and diode 109*d*. One side of phase change element 106*d* is electrically coupled to bit line 112*b* and the other side of phase change element 106*d* is electrically coupled to one side of diode 109*d*. The other side of diode 109*d* is electrically coupled to word line 110*b*.

In another embodiment, each phase change element 106 is electrically coupled to a word line 110 and each diode 109 is electrically coupled to a bit line 112. For example, for phase change memory cell 104*a*, one side of phase change element 106*a* is electrically coupled word line 110*a*. The other side of phase change element 106*a* is electrically coupled to one side of diode 109*a*. The other side of diode 109*a* is electrically coupled to bit line 112*a*.

In one embodiment, diodes 109 include a similar bipolar pnp or npn structure as transistors 108 but substantially all current for reading or writing phase change elements 106 is passed through a word line 110 and a base region of each diode 109. In this embodiment, the collector pn junction serves as an insulation junction to provide the diode select devices. Memory device 100*b* operates similarly to memory device 100*a*.

The remaining FIGS. 2-28 and the accompanying descriptions are applicable to both bipolar transistor select devices and diode select devices. In the following description, in one embodiment the collector regions, base regions, and emitter regions are used to form bipolar transistors 108. In another embodiment, the base regions and the emitter regions are used to form diodes 109 with the collector regions providing insulation.

Figure 2:
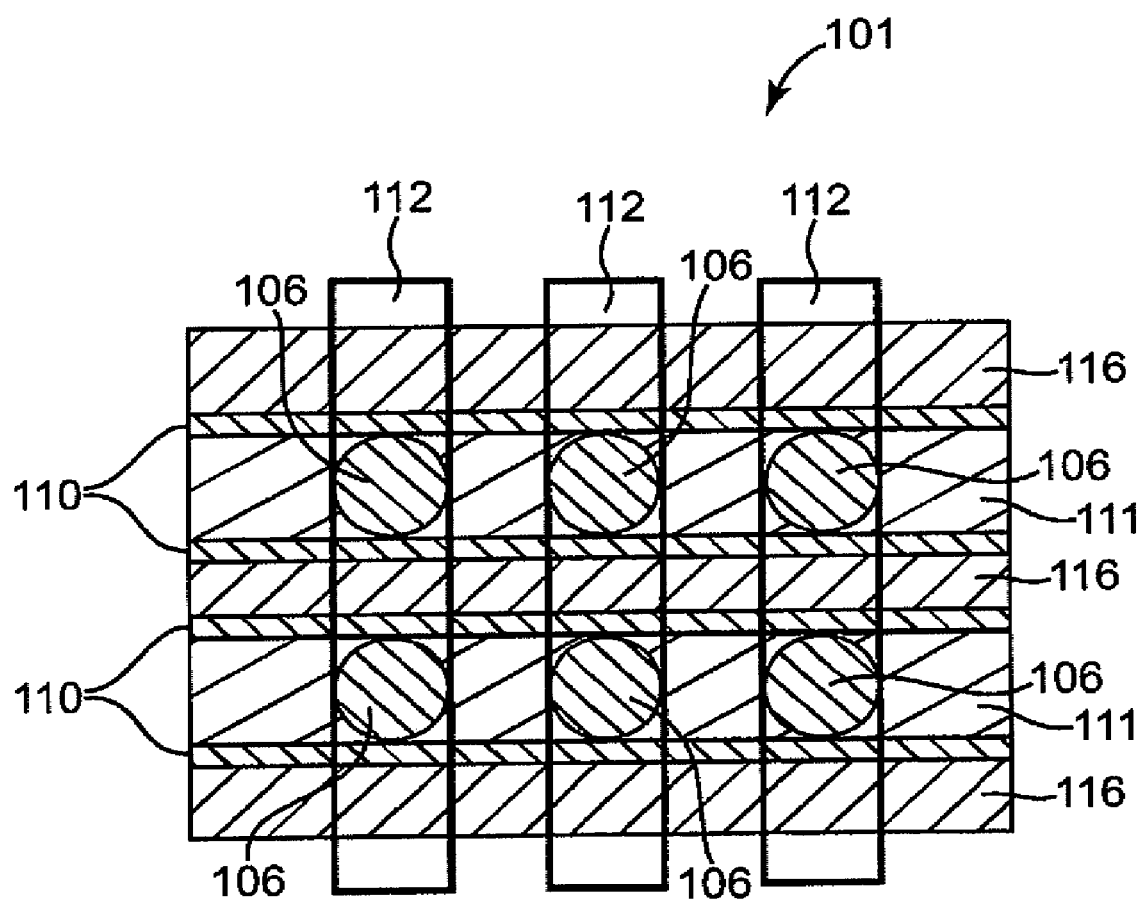
FIG. 2 illustrates a top view of one embodiment of an array of phase change memory cells.

FIG. 2 illustrates a top view of array phase change memory cells 101. Each phase change element 106 is electrically coupled to the emitter of a vertical bipolar transistor. The base of each vertical bipolar transistor contacts a buried metallized word line 110. Each buried metallized word line 110 extends on each side of each base region of each bipolar transistor. In one embodiment, word lines 110 are substantially perpendicular to bit lines 112. A contact between a buried metallized word line 110 and a metal word line 111 in a higher metallization layer is located in place of a phase change element 106 for every two or more phase change elements 106. Shallow trench isolation (STI) 116 electrically isolates each memory cell from adjacent memory cells.

In another embodiment, where substantially all current is passed through a word line 110 and a base, each phase change element is selected by a diode. In this embodiment, each phase change element 106 is electrically coupled to the emitter of a vertical diode. The base of each vertical diode contacts a buried metallized word line 110. Each buried metallized word line 110 extends on each side of each base region of each diode. In one embodiment, word lines 110 are substantially perpendicular to bit lines 112.

Figure 3:
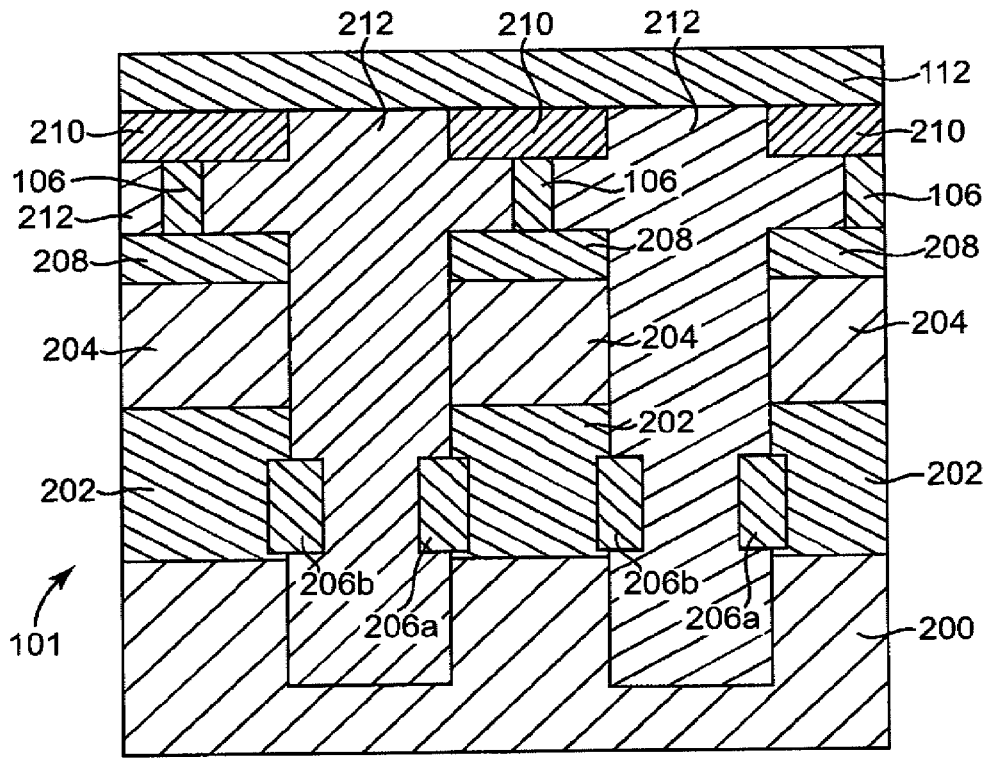
FIG. 3 illustrates a cross-sectional view of one embodiment of an array of phase change memory cells.
Figure 4:
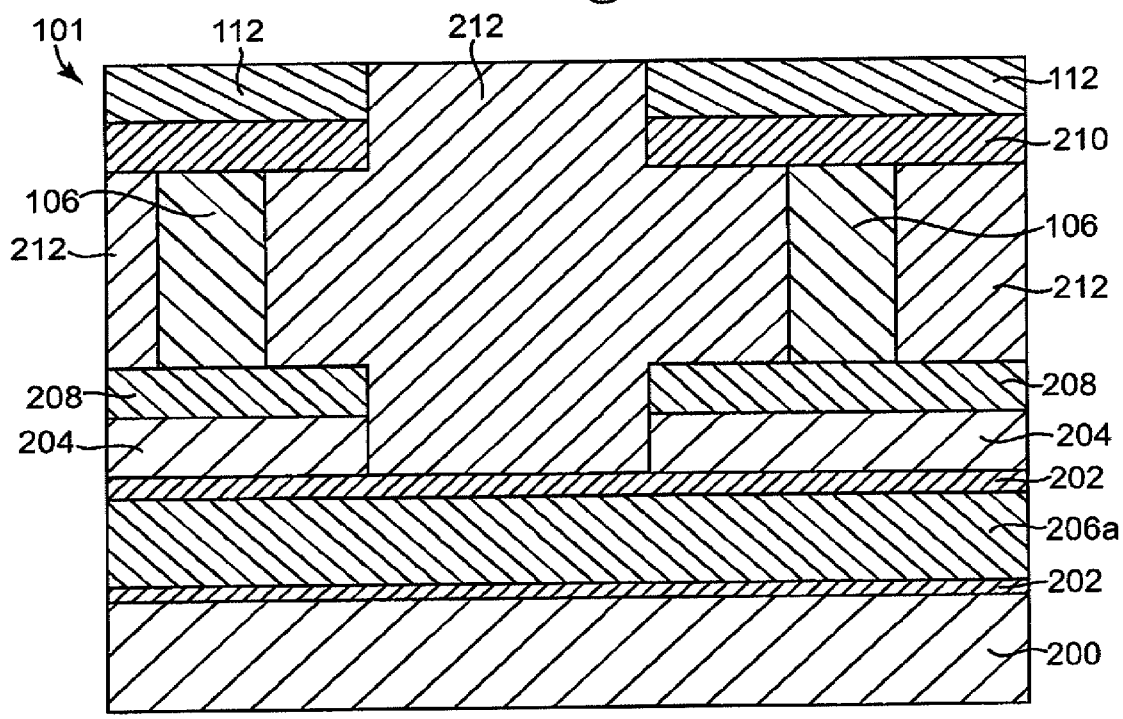
FIG. 4 illustrates a cross-sectional view of one embodiment of an array of phase change memory cells.

FIG. 3 and FIG. 4 illustrate cross-sectional views of one embodiment of array of phase change memory cells 101. The cross-sectional view illustrated in FIG. 4 is perpendicular to the cross-sectional view illustrated in FIG. 3. Array of phase change memory cells 101 includes a substrate and collector regions 200, base regions 202, emitter regions 204, buried metallized word lines 206*a*-206*b*, first contacts 208, phase change elements 106, second contacts 210, bit lines 112, and isolation material 212.

In one embodiment, each collector region 200, base region 202, and emitter region 204 provides a vertical bipolar transistor 108. In another embodiment, each collector region 200 provides insulation and each base region 202 and emitter region 204 provides a vertical diode 109. Each emitter region 204 is electrically coupled to a first contact 208. Each first contact 208 is electrically coupled to a phase change element 106. Each phase change element 106 is electrically coupled to a second contact 210. Each second contact 210 is electrically coupled to a bit line 112. Buried word line portion 206*a* extends on one side of each base region 202, and buried word line portion 206b extends along the opposite side of each base region 202. Isolation material 212 provides shallow trench isolation (STI) to electrically isolate each phase change memory cell from adjacent memory cells.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Isolation material 212 can include suitable dielectric material, such as $SiO_2$, fluorinated silica glass (FSG), boro-phosphorous silicate glass (BPSG), boro-silicate glass (BSG), or low-k material. First contact 208 and second contact 210 include any suitable contact material, such as TiN, TaN, W, C, TiSiN, TiAlN, TaAlN, or silicide. Buried word line portions 206a and 206b can include any suitable metal or silicide, such as Co, Ti, W, TiN, $CoSi_2$, TiSi, NiSi, or NiPtSi. Bit lines 112 can include any suitable electrically conductive material, such as Cu, Al, or W.

In one embodiment, bipolar transistors 108 are pnp transistors, such that collector regions 200 are p-type, base regions 202 are n-type, and emitter regions 204 are p-type. In another embodiment, transistors 108 are npn transistors, such that collector regions 200 are n-type, base regions 202 are p-type, and emitter regions 204 are n-type.

In another embodiment, diodes 109 are np diodes, such that base regions 202 are n-type and emitter regions 204 are p-type. In another embodiment, diodes 109 are pn diodes, such that base regions 202 are p-type and emitter regions 204 are n-type.

First contacts 208, phase change elements 106, and second contacts 210 can have any suitable dimensions and can be arranged in any suitable configuration, such as in a pillar or via configuration. In addition, first contacts 208 and/or second contacts 210 can include heater contacts for heating phase change elements 106 during programming.

Figure 5:
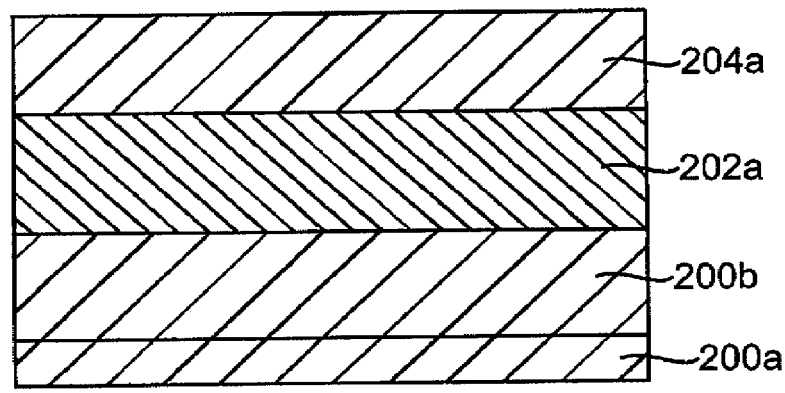
FIG. 5 illustrates a cross-sectional view of one embodiment of a substrate, a first material layer, a second material layer, and a third material layer.

The following FIGS. 5-11 illustrate one embodiment of a process for fabricating phase change memory array 101. FIG. 5 illustrates a cross-sectional view of one embodiment of a substrate 200a, a first material layer 200b, a second material layer 202a, and a third material layer 204a. Using epitaxy, a p-type material layer is grown on a p-type substrate 200a to provide first material layer 200b. An n-type material layer is grown on first material layer 200b to provide second material layer 202a. A p-type material layer is grown on second material layer 202a to provide third material layer 204a.

In another embodiment, substrate 200a includes an n-type well in a p-type substrate. In this embodiment, an n-type material layer is grown on an n-type well 200a to provide first material layer 200b. A p-type material layer is grown on first material layer 200b to provide second material layer 202a. An n-type material layer is grown on second material layer 202a to provide third material layer 204a. In another embodiment, suitable doping concentration profiles for substrate 200a, first material layer 200b, second material layer 202a, and third material layer 204a are achieved using ion implantation into the silicon instead of the epitaxy steps described above.

Figure 6:
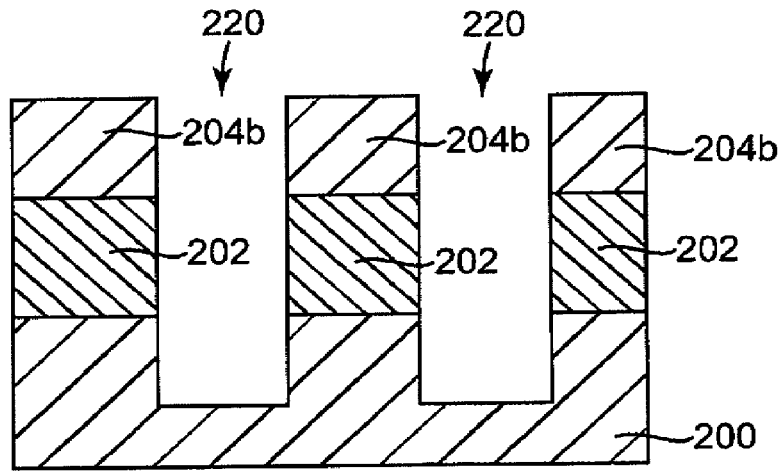
FIG. 6 illustrates a cross-sectional view of one embodiment of collector regions, base regions, and emitter portions after etching trenches into the first material layer, the second material layer, and the third material layer.

FIG. 6 illustrates a cross-sectional view of one embodiment of collector regions 200, base regions 202, and emitter portions 204b after etching trenches 220 into third material layer 204a, second material layer 202a, and first material layer 200b. Third material layer 204a, second material layer 202a, and first material layer 200b are etched to provide trenches 220 and emitter portions 204b, base regions 202, and collector regions 200.

Figure 7:
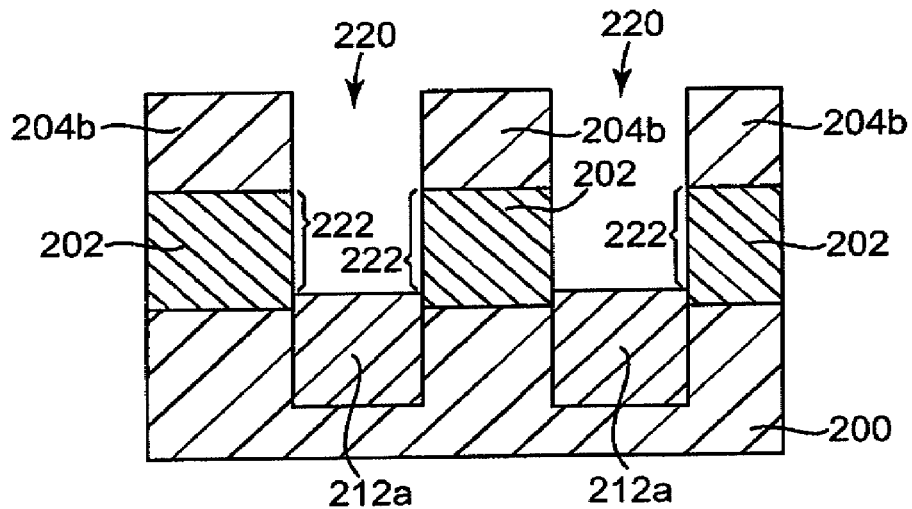
FIG. 7 illustrates a cross-sectional view of one embodiment of the collector regions, the base regions, the emitter portions, and a first isolation material layer.

FIG. 7 illustrates a cross-sectional view of one embodiment of collector regions 200, base regions 202, emitter portions 204b, and a first isolation material layer 212a. Isolation material, such as $SiO_2$, FSG, BPSG, BSG, low-k material, or other suitable dielectric material is deposited over exposed portions of collector regions 200, base regions 202, and emitter portions 204b. The isolation material is deposited using chemical vapor deposition (CVD), high density plasma-CVD (HDP-CVD), atomic layer deposition (ALD), metal organic chemical vapor deposition (MOCVD), physical vapor deposition (PVD), jet vapor deposition (JVP), or other suitable deposition technique. The isolation material is then recess etched to expose emitter portions 204b and a first portion 222 of base regions 202 to provide first isolation material layer 212a. First isolation material layer 212a protects each pn junction between collector regions 200 and base regions 202 from being electrically shorted in the following processing steps.

Figure 8:
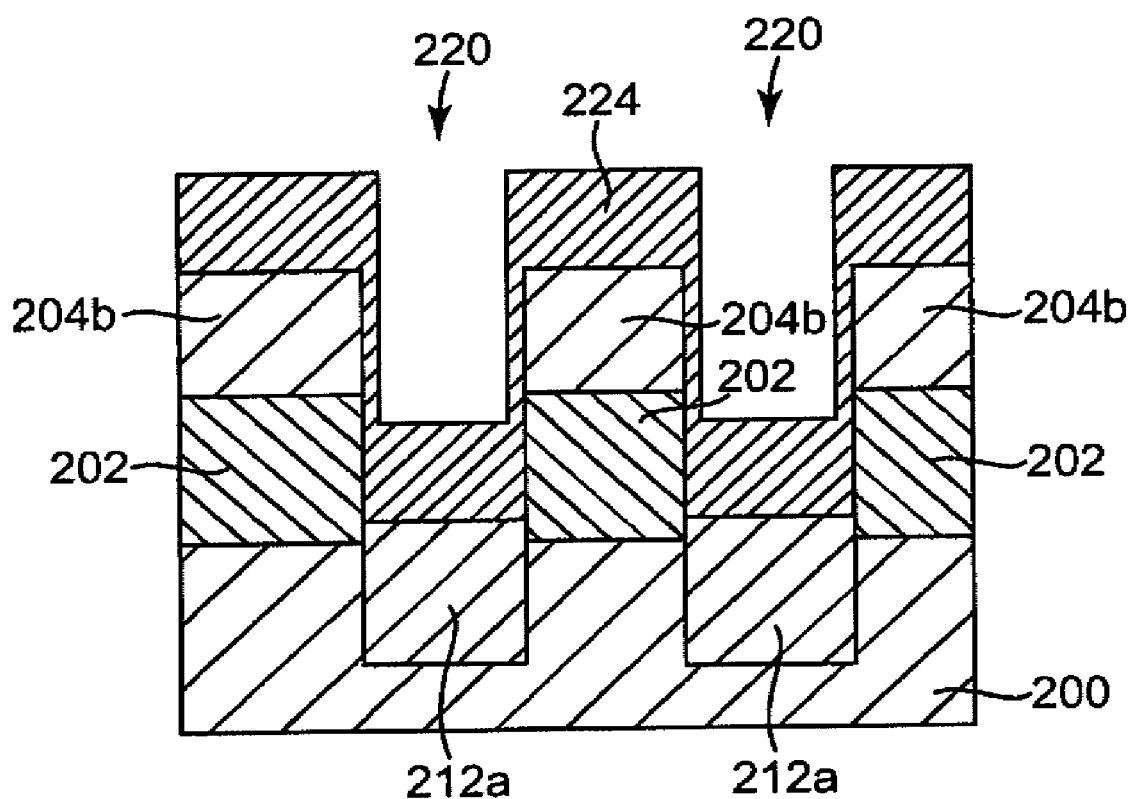
FIG. 8 illustrates a cross-sectional view of one embodiment of the collector regions, the base regions, the emitter portions, the first isolation material layer, and a metal layer.

FIG. 8 illustrates a cross-sectional view of one embodiment of collector regions 200, base regions 202, emitter portions 204b, first isolation material layer 212a, and a metal layer 224. A metal, such as Co, Ti, W, Ni, NiPt, or other suitable metal, is deposited over exposed portions of emitter portions 204b, base regions 202, and first isolation material layer 212a to provide metal layer 224. The metal is deposited by PVD or another suitable deposition technique using a line of sight technique so that very little metal is deposited on the sidewalls of emitter portions 204b.

Figure 9:
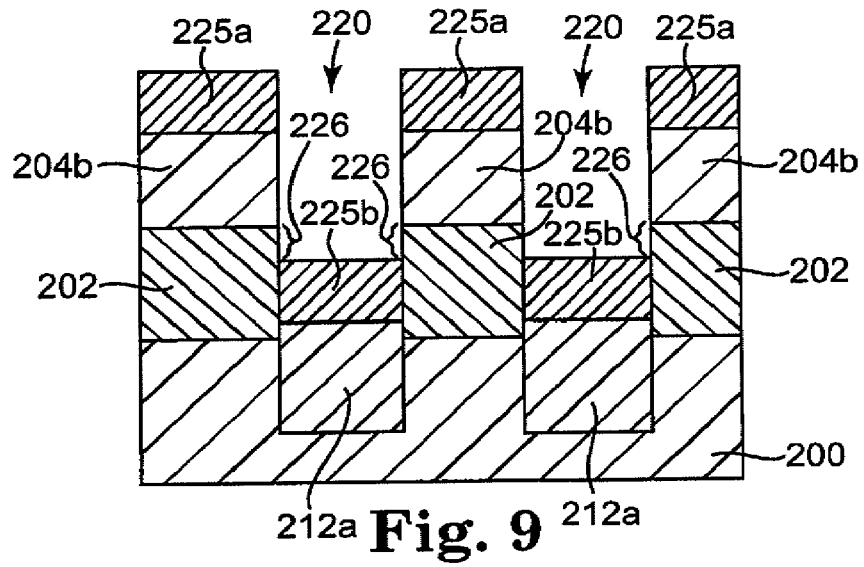
FIG. 9 illustrates a cross-sectional view of one embodiment of the collector regions, the base regions, the emitter portions, the first isolation material layer, and the metal layer after etching the metal layer.

FIG. 9 illustrates a cross-sectional view of one embodiment of collector regions 200, base regions 202, emitter portions 204b, first isolation material layer 212a, and metal layers 225a and 225b after etching metal layer 224. Metal layer 224 is recess etched to expose the sidewalls of emitter portions 204b and a second portion 226 of base regions 202 to provide metal layers 225a and 225b. Metal layer 224 is etched using an isotropic wet chemical etch or another suitable etch to remove the metal from the sidewalls of emitter portions 204b and second portion 226 of base regions 202. After etching, metal layer 225a remains on top of emitter portions 204b, and metal layer 225b remains on top of first isolation material layer 212a and adjacent base regions 202. Metal layers 225a and 225b are then annealed such that salicide is formed at the interface of metal layer 225a and emitter portions 204b and salicide is formed at the interface of metal layer 225b and base regions 202.

Figure 10:
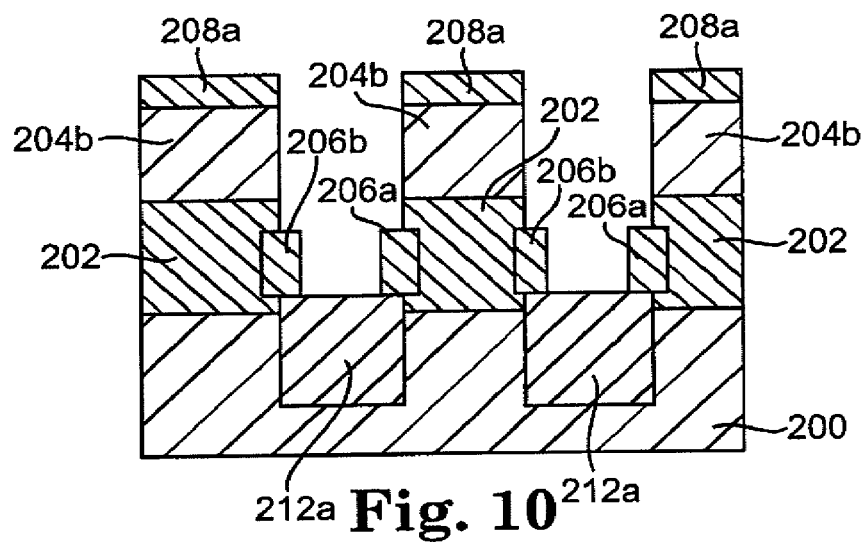
FIG. 10 illustrates a cross-sectional view of one embodiment of the collector regions, the base regions, the emitter portions, the first isolation material layer, salicide word lines, and salicide contacts after annealing and selectively etching any remaining metal.

FIG. 10 illustrates a cross-sectional view of one embodiment of collector regions 200, base regions 202, emitter portions 204b, first isolation material layer 212a, salicide contacts 208a, and salicide word lines 206a-206b. After annealing, any remaining metal is selectively etched to provide salicide contacts 208a and salicide word lines 206a-206b. After etching the remaining metal, salicide contacts 208a remain on top of emitter portions 204b. Salicide word line portions 206a contact one side of base regions 202, and salicide word line portions 206b contact the opposite side of base regions 202.

Figure 11:
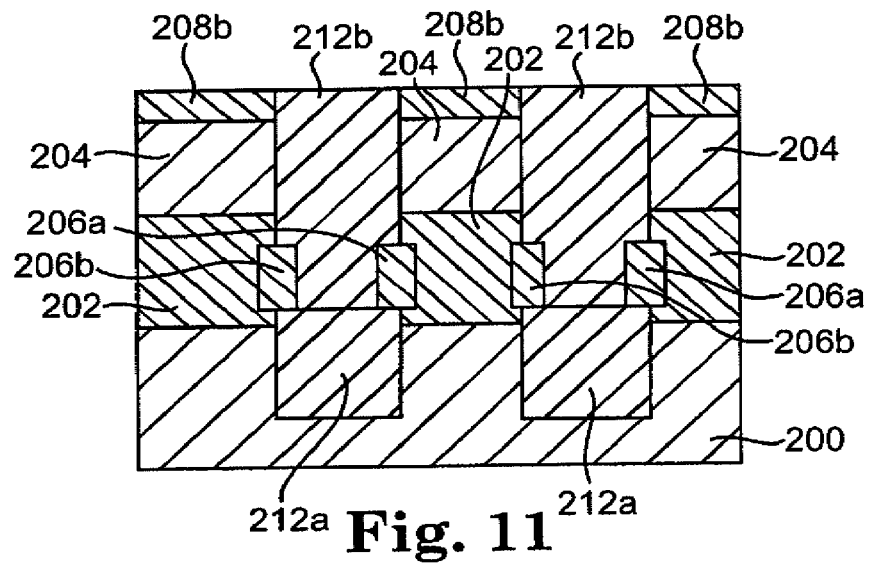
FIG. 11 illustrates a cross-sectional view of one embodiment of the collector regions, the base regions, emitter regions, the first isolation material layer, the salicide word lines, the salicide contacts, and a second isolation material layer.

FIG. 11 illustrates a cross-sectional view of one embodiment of collector regions 200, base regions 202, emitter regions 204, first isolation material layer 212a, salicide contacts 208b, buried salicide words lines 206a-206b, and a second isolation material layer 212b. Salicide contacts 208a are etched to provide salicide contacts 208b, which form a part of first contacts 208 illustrated in FIG. 4. Emitter portions 204b are etched to provide emitter regions 204 as illustrated in FIG. 4.

Isolation material, such as $SiO_2$, FSG, BPSG, BSG, low-k material, or other suitable dielectric material is deposited over exposed portions of salicide contacts 208b, emitter regions 204, base regions 202, salicide word lines 206a-206b, and first isolation material layer 212a. The isolation material is deposited using CVD, HDP-CVD, ALD, MOCVD, PVD, JVP, or other suitable deposition technique. The isolation material is then planarized using chemical mechanical planarization (CMP) or another suitable planarization technique to expose salicide contacts 208b. Additional first contact 208 parts, phase change elements 106, second contacts 210, and bit lines 112 are then fabricated to provide array of phase change memory cells 101 as previously described and illustrated with reference to FIGS. 2-4.

Figure 12:
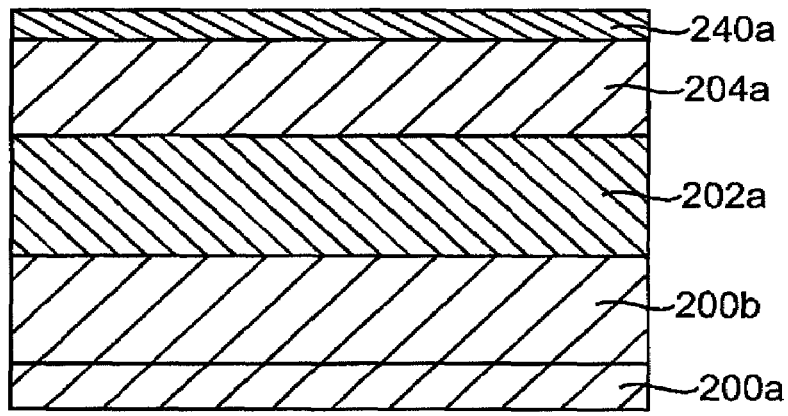
FIG. 12 illustrates a cross-sectional view of one embodiment of a substrate, a first material layer, a second material layer, a third material layer, and a protection material layer.

The following FIGS. 12-18 illustrate another embodiment of a process for fabricating an array of phase change memory cells 101. FIG. 12 illustrates a cross-sectional view of one embodiment of a substrate 200a, a first material layer 200b, a second material layer 202a, a third material layer 204a, and a protection material layer 240a. Using epitaxy, a p-type material layer is grown on a p-type substrate 200a to provide first material layer 200b. An n-type material layer is grown on first material layer 200b to provide second material layer 202a. A p-type material layer is grown on second material layer 202a to provide third material layer 204a.

In another embodiment, substrate 200a includes an n-type well in a p-type substrate. In this embodiment, an n-type material layer is grown on an n-type well 200a to provide first material layer 200b. A p-type material layer is grown on first material layer 200b to provide second material layer 202a. An n-type material layer is grown on second material layer 202a to provide third material layer 204a. In another embodiment, suitable doping concentration profiles for substrate 200a, first material layer 200b, second material layer 202a, and third material layer 204a are achieved using ion implantation into the silicon instead of the epitaxy steps described above.

A protection material, such as SiN or another suitable dielectric material, is deposited over third material layer 204a to provide protection material layer 240a. Protection material layer 240a is deposited using CVD, HDP-CVD, ALD, MOCVD, PVD, JVP, or other suitable deposition technique.

Figure 13:
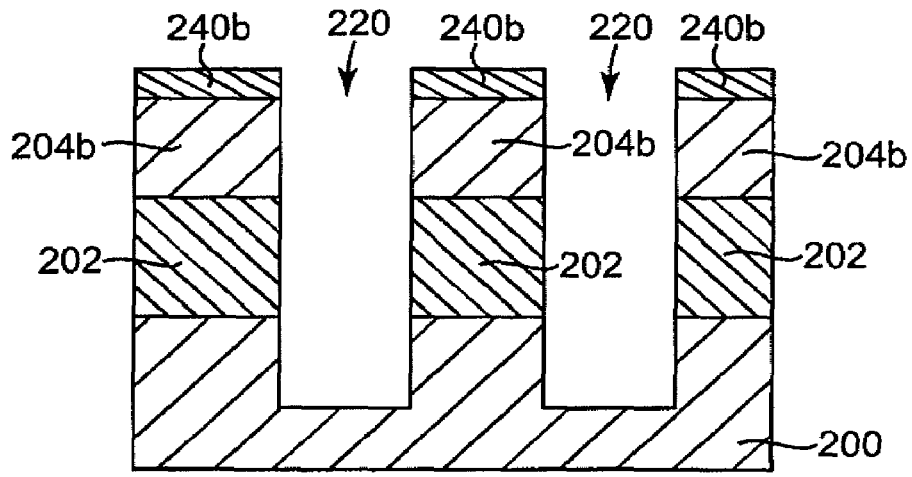
FIG. 13 illustrates a cross-sectional view of one embodiment of the substrate, collector regions, base regions, emitter portions, and the protection material layer after etching trenches in the first material layer, the second material layer, the third material layer, and the protection material layer.

FIG. 13 illustrates a cross-sectional view of one embodiment of collector regions 200, base regions 202, emitter portions 204b, and protection material layer 240b after etching trenches 220 into protection material layer 240a, third material layer 204a, second material layer 202a, and first material layer 200b. Protection material layer 240a, third material layer 204a, second material layer 202a, and first material layer 200b are etched to provide trenches 220 and protection material layer 240b, emitter portions 204b, base regions 202, and collector regions 200.

Figure 14:
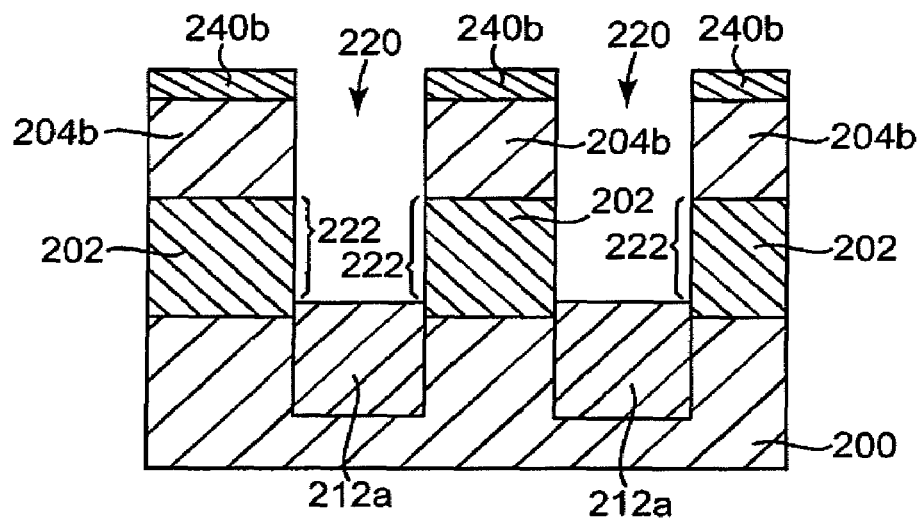
FIG. 14 illustrates a cross-sectional view of one embodiment of the collector regions, the base regions, the emitter portions, the protection material layer, and a first isolation material layer.

FIG. 14 illustrates a cross-sectional view of one embodiment of collector regions 200, base regions 202, emitter portions 204b, protection material layer 240b, and a first isolation material layer 212a. Isolation material, such as $SiO_2$, FSG, BPSG, BSG, low-k material, or other suitable dielectric material is deposited over exposed portions of collector regions 200, base regions 202, emitter portions 204b, and protection material layer 240b. The isolation material is deposited using CVD, HDP-CVD, ALD, MOCVD, PVD, JVP, or other suitable deposition technique. The isolation material is then recess etched to expose protection material layer 240b, emitter portions 204b, and a first portion 222 of base regions 202 to provide first isolation material layer 212a. First isolation material layer 212a protects each pn junction between collector regions 200 and base regions 202 from being electrically shorted in the following processing steps.

Figure 15:
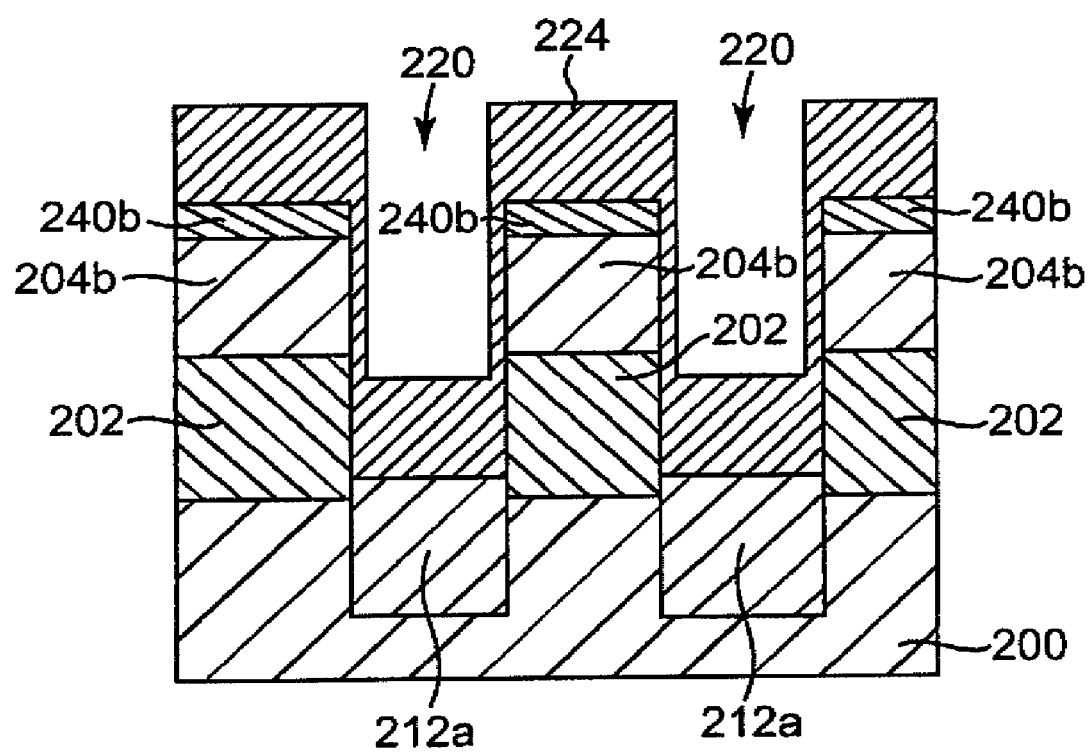
FIG. 15 illustrates a cross-sectional view of one embodiment of the collector regions, the base regions, the emitter portions, the protection material layer, the first isolation material layer, and a metal layer.

FIG. 15 illustrates a cross-sectional view of one embodiment of collector regions 200, base regions 202, emitter portions 204b, protection material layer 240b, first isolation material layer 212a, and a metal layer 224. A metal, such as Co, Ti, W, Ni, NiPt, or other suitable metal is deposited over exposed portions of base regions 202, emitter portions 204b, protection material layer 240b, and first isolation material layer 212a to provide metal layer 224. The metal is deposited by PVD or another suitable deposition technique using a line of sight technique so that very little metal is deposited on the sidewalls of emitter portions 204b and on the sidewalls of protection material layer 240b.

Figure 16:
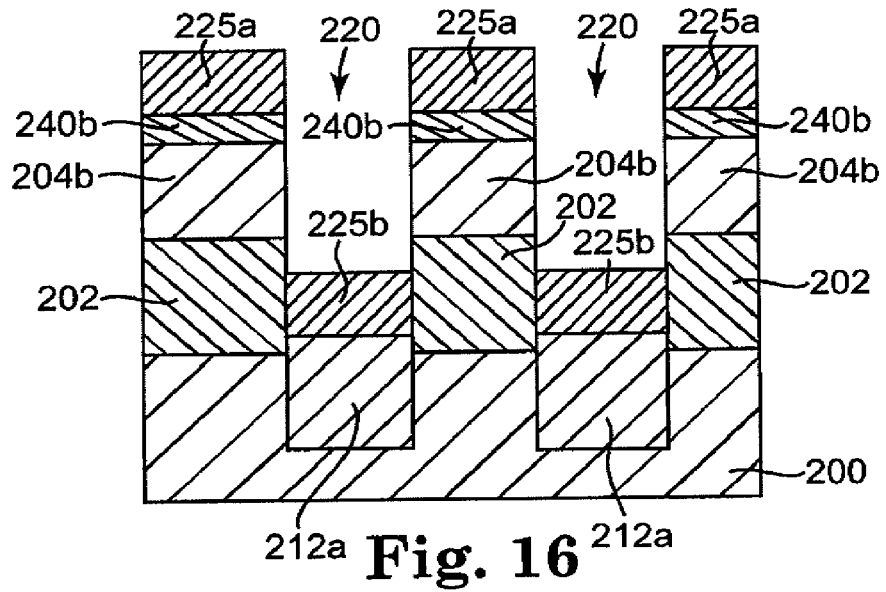
FIG. 16 illustrates a cross-sectional view of one embodiment of the collector regions, the base regions, the emitter portions, the protection material layer, the first isolation material layer, and the metal layer after etching the metal layer.

FIG. 16 illustrates a cross-sectional view of one embodiment of collector regions 200, base regions 202, emitter portions 204b, protection material layer 240b, first isolation material layer 212a, and metal layers 225a and 225b after etching metal layer 224. Metal layer 224 is recess etched to expose the sidewalls of protection material layer 240b, emitter portions 204b, and a second portion 226 of base regions 202 to provide metal layers 225a and 225b. Metal layer 224 is etched using an isotropic wet chemical etch or another suitable etch to remove the metal from the sidewalls of protection material layer 240b, emitter portions 204b, and second portion 226 of base regions 202. After etching, metal layer 225a remains on top of protection material layer 240b, and metal layer 225b remains on top of first isolation material 212a and adjacent base regions 202. Metal layers 225a and 225b are then annealed such that salicide is formed at the interface of metal layer 225b and base regions 202. Protection material layer 240b prevents salicide from forming between metal layer 225a and emitter portions 204b.

Figure 17:
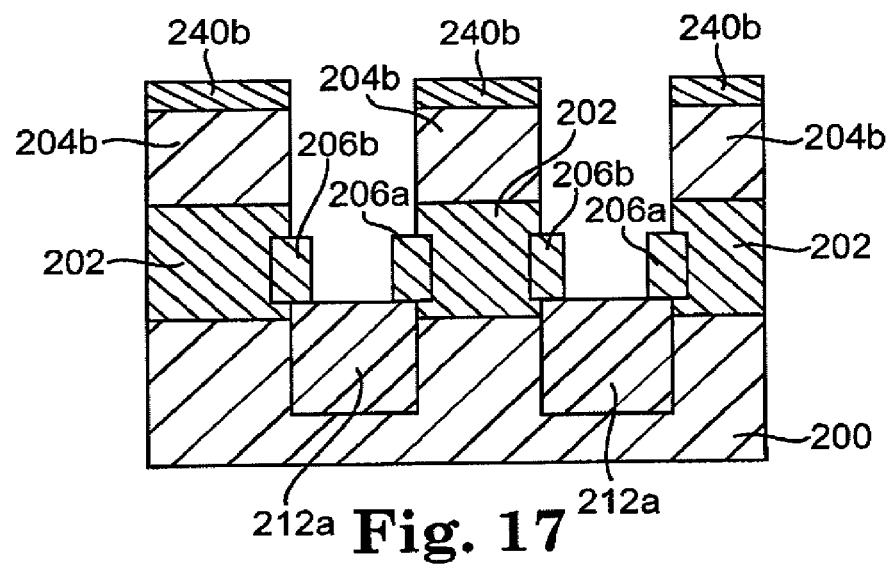
FIG. 17 illustrates a cross-sectional view of one embodiment of the collector regions, the base regions, the emitter portions, the protection material layer, the first isolation material layer, and salicide word lines after annealing and selectively etching any remaining metal.

FIG. 17 illustrates a cross-sectional view of one embodiment of collector regions 200, base regions 202, emitter portions 204b, protection material layer 240b, first isolation material layer 212a, and salicide word lines 206a-206b. After annealing, any remaining metal is selectively etched to remove metal layer 225a and provide salicide word lines 206a-206b. Salicide word line portions 206a contact one side of base regions 202, and salicide word line portions 206b contact the opposite side of base regions 202.

Figure 18:
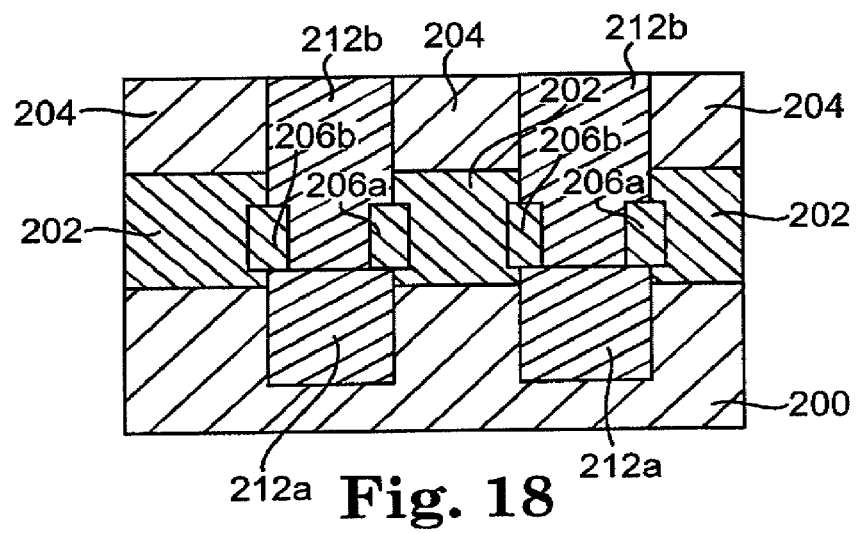
FIG. 18 illustrates a cross-sectional view of one embodiment of the collector regions, the base regions, the emitters regions, the salicide word lines, and a second isolation material layer.

FIG. 18 illustrates a cross-sectional view of one embodiment of collector regions 200, base regions 202, emitter regions 204, first isolation material layer 212a, buried salicide words lines 206a-206b, and a second isolation material layer 212b. Protection material layer 240b is removed by selective etching. Emitter portions 204b are etched to form emitter regions 204 as illustrated in FIG. 4.

Isolation material, such as $SiO_2$, FSG, BPSG, BSG, low-k material, or other suitable dielectric material is deposited over exposed portions of emitter regions 204, base regions 202, salicide word lines 206a-206b, and first isolation material layer 212a. The isolation material is deposited using CVD, HDP-CVD, ALD, MOCVD, PVD, JVP, or other suitable deposition technique. The isolation material is then planarized using CMP or another suitable planarization technique to expose emitter regions 204. First contacts 208, phase change elements 106, second contacts 210, and bit lines 112 are then fabricated to provide array of phase change memory cells 101 as previously described and illustrated with reference to FIGS. 2-4.

Figure 19:
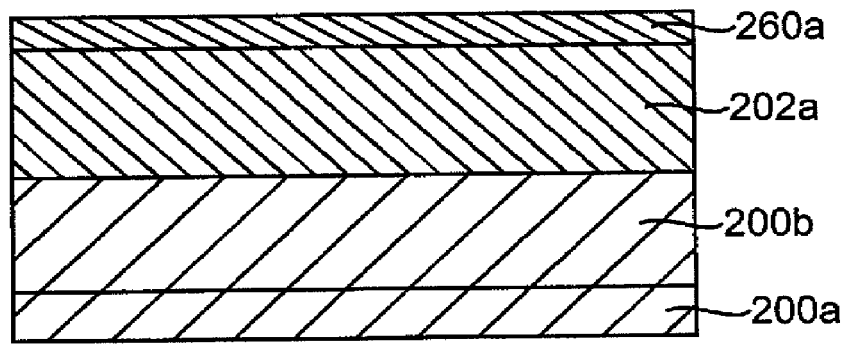
FIG. 19 illustrates a cross-sectional view of one embodiment of a substrate, a first material layer, a second material layer, and a protection material layer.

The following FIGS. 19-28 illustrate another embodiment of a process for fabricating an array of phase change memory cells 101. FIG. 19 illustrates a cross-sectional view of one embodiment of a substrate 200a, a first material layer 200b, a second material layer 202a, and a protection material layer 260a. Using epitaxy, a p-type material layer is grown on a p-type substrate 200a to provide first material layer 200b. An n-type material layer is grown on first material layer 200b to provide second material layer 202a. In another embodiment, substrate 200a includes an n-type well in a p-type substrate. In this embodiment, an n-type material layer is grown on an n-type well 200a to provide first material layer 200b. A p-type material layer is grown on first material layer 200b to provide second material layer 202a. In another embodiment, suitable doping concentration profiles for substrate 200a, first material layer 200b, and second material layer 202a are achieved using ion implantation into the silicon instead of the epitaxy steps described above.

A protection material, such as SiN or another suitable dielectric material, is deposited over second material layer 202a to provide protection material layer 260a. Protection material layer 260a is deposited using CVD, HDP-CVD, ALD, MOCVD, PVD, JVP, or other suitable deposition technique.

Figure 20:
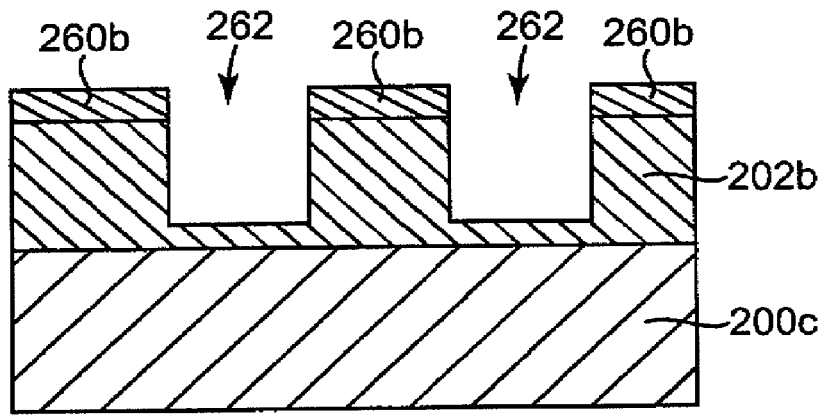
FIG. 20 illustrates a cross-sectional view of one embodiment of the substrate, the first material layer, the second material layer, and the protection material layer after etching trenches in the protection material layer and the second material layer.

FIG. 20 illustrates a cross-sectional view of one embodiment of first material layer 200c, second material layer 202b, and protection material layer 260b after etching trenches 262 into protection material layer 260a and second material layer 202a. Substrate 200a and first material layer 200b are combined to provide first material layer 200c. Protection material layer 260a and second material layer 202a are etched to provide trenches 262 and protection material layer 260b and second material layer 202b. Second material layer 202b completely covers first material layer 200c.

Figure 21:
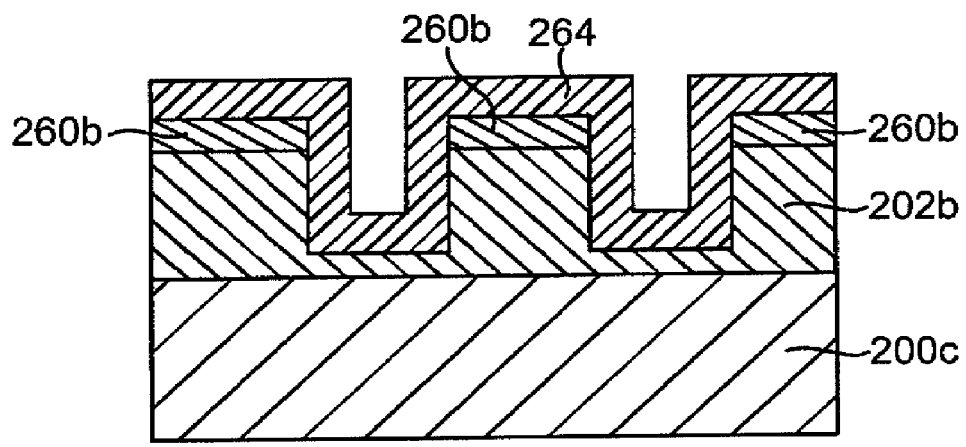
FIG. 21 illustrates a cross-sectional view of one embodiment of the first material layer, the second material layer, the protection material layer, and a metal layer.

FIG. 21 illustrates a cross-sectional view of one embodiment of first material layer 200c, second material layer 202b, protection material layer 260b, and a metal layer 264. A metal, such as Co, Ti, W, Ni, NiPt, or other suitable metal is conformally deposited over exposed portions of protection material layer 260b and second material layer 202b to provide metal layer 264.

Figure 22:
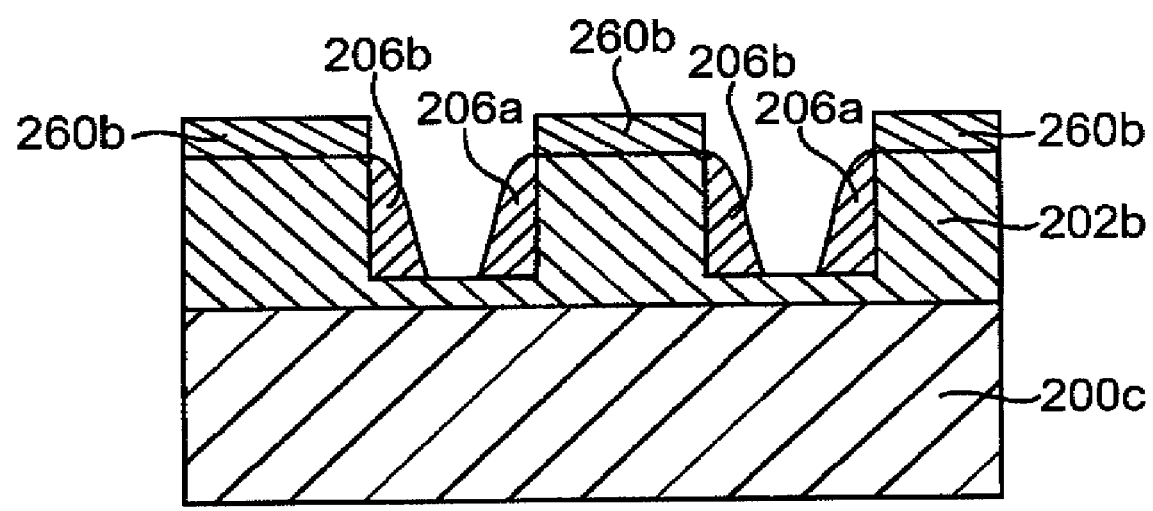
FIG. 22 illustrates a cross-sectional view of one embodiment of the first material layer, the second material layer, the protection material layer, and spacers after etching the metal layer.

FIG. 22 illustrates a cross-sectional view of one embodiment of first material layer 200c, second material layer 202b, protection material layer 260b, and spacers 206a and 206b. Metal layer 264 is etched using a spacer etch to provide spacers 206a and 206b. Spacers 206a-206b provide metal word lines. In one embodiment, metal word lines 206a-206b are annealed to form salicide word lines.

Figure 23:
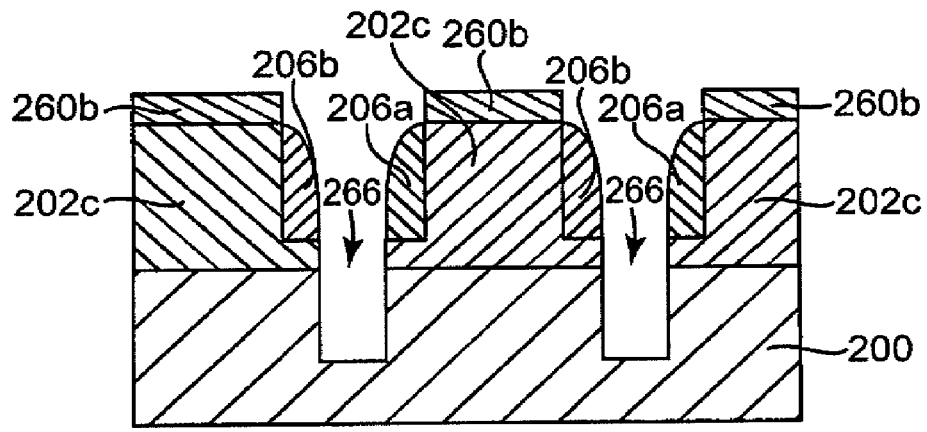
FIG. 23 illustrates a cross-sectional view of one embodiment of collector regions, the second material layer, the protection material layer, and the word lines after etching trenches self aligned to the word lines into the second material layer and the first material layer.

FIG. 23 illustrates a cross-sectional view of one embodiment of collector regions 200, second material layer 202c, a protection material layer 260b, and word lines 206a-206b after etching trenches 266. Second material layer 202b and first material layer 200c are etched to provide trenches 266, which are self aligned to word lines 206a-206b, and to provide second material layer 202c and collector regions 200.

Figure 24:
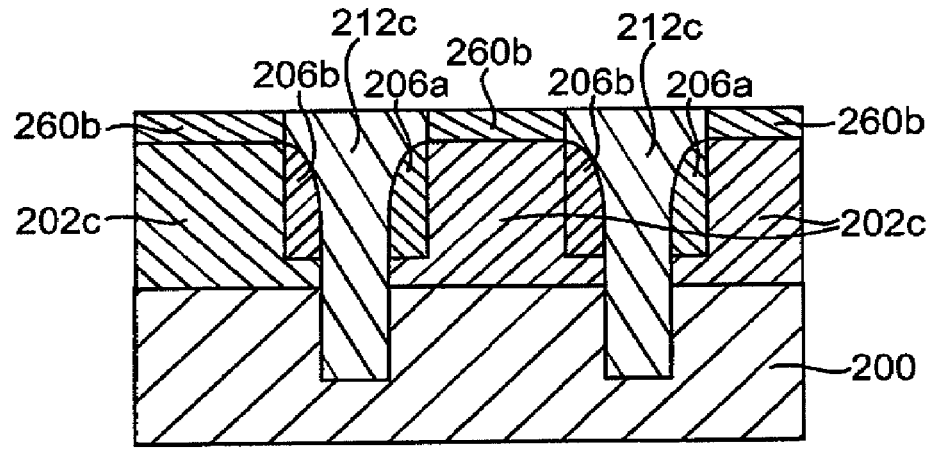
FIG. 24 illustrates a cross-sectional view of one embodiment of the collector regions, the second material layer, the protection material layer, the buried word lines, and a first isolation material layer.

FIG. 24 illustrates a cross-sectional view of one embodiment of collector regions 200, second material layer 202c, buried word lines 206a-206b, protection material layer 260b, and a first isolation material layer 212c. Isolation material, such as SiO$_2$, FSG, BPSG, BSG, low-k material, or other suitable dielectric material is deposited over exposed portions of collector regions 200, second material layer 202c, word lines 206a-206b, and protection material layer 260b. The isolation material is deposited using CVD, HDP-CVD, ALD, MOCVD, PVD, JVP, or other suitable deposition technique. The isolation material is then planarized using CMP or another suitable planarization technique to expose protection material layer 260b and provide first isolation material layer 212c.

Figure 25:
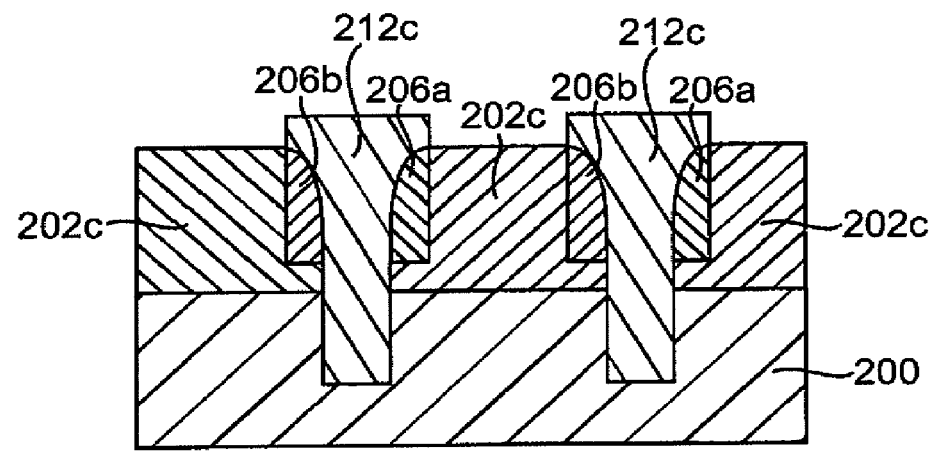
FIG. 25 illustrates a cross-sectional view of one embodiment of the collector regions, the second material layer, the spacers, and the first isolation material layer after selectively etching the protection material layer.

FIG. 25 illustrates a cross-sectional view of one embodiment of collector regions 200, second material layer 202c, buried word lines 206a-206b, and isolation material layer 212c. Protection material layer 260b is removed by using a selective etch to expose second material layer 202c.

Figure 26:
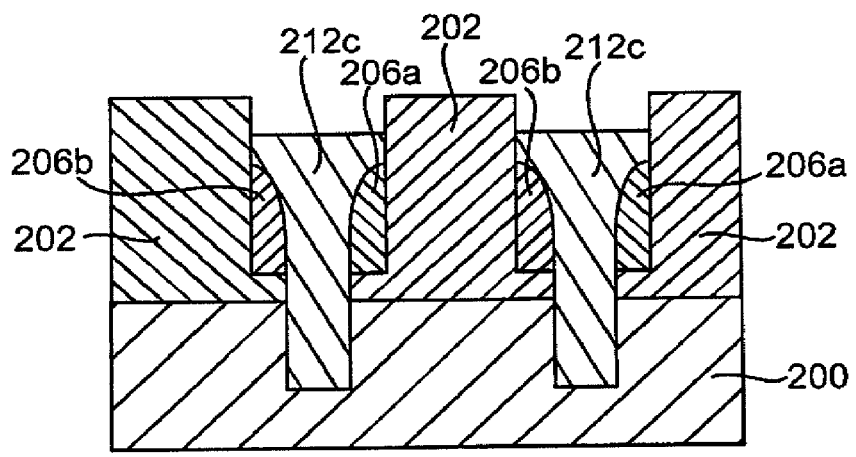
FIG. 26 illustrates a cross-sectional view of one embodiment of the collector regions, base regions, the buried word lines, and the first isolation material layer.

FIG. 26 illustrates a cross-sectional view of one embodiment of collector regions 200, buried word lines 206a-206b, isolation material layer 212c, and base regions 202. Using epitaxy, base material is grown on second material layer 202c to provide base regions 202. In one embodiment, where second material layer 202c includes n-type material, n-type base material is grown on second material layer 202c to provide n-type base regions 202. In another embodiment, where second material layer 202c includes p-type material, p-type base material is grown on second material layer 202c to provide p-type base regions 202.

Figure 27:
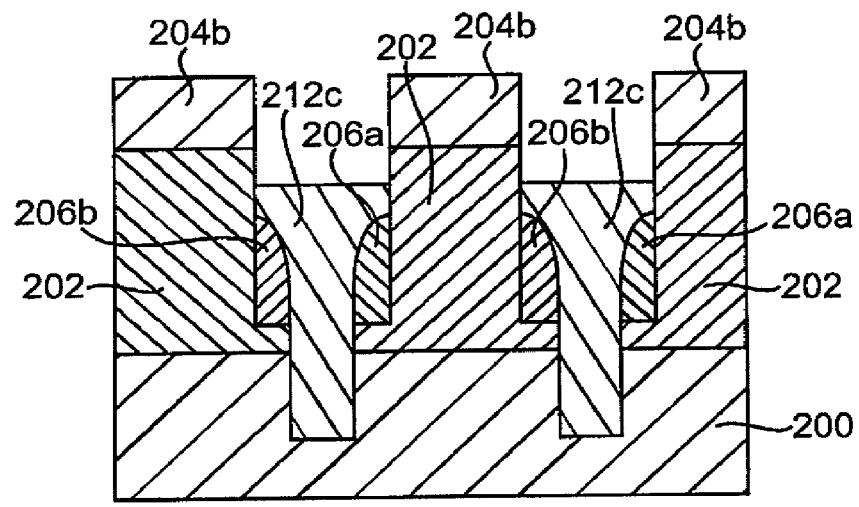
FIG. 27 illustrates a cross-sectional view of one embodiment of the collector regions, the base regions, the buried word lines, the first isolation material, and emitter portions.

FIG. 27 illustrates a cross-sectional view of one embodiment of collector regions 200, base regions 202, buried word lines 206a-206b, isolation material layer 212c, and emitter portions 204b. Using epitaxy, emitter portions 204b are grown on base regions 202. In one embodiment, where base regions 202 include n-type material, p-type emitter material is grown on base regions 202 to provide p-type emitter portions 204b. In another embodiment, where base regions 202 include p-type material, n-type emitter material is grown on base regions 202 to provide n-type emitter portions 204b. In another embodiment, ion implantation is used to adjust the doping level in the upper portion of base regions 202 to provide emitter portions 204b.

Figure 28:
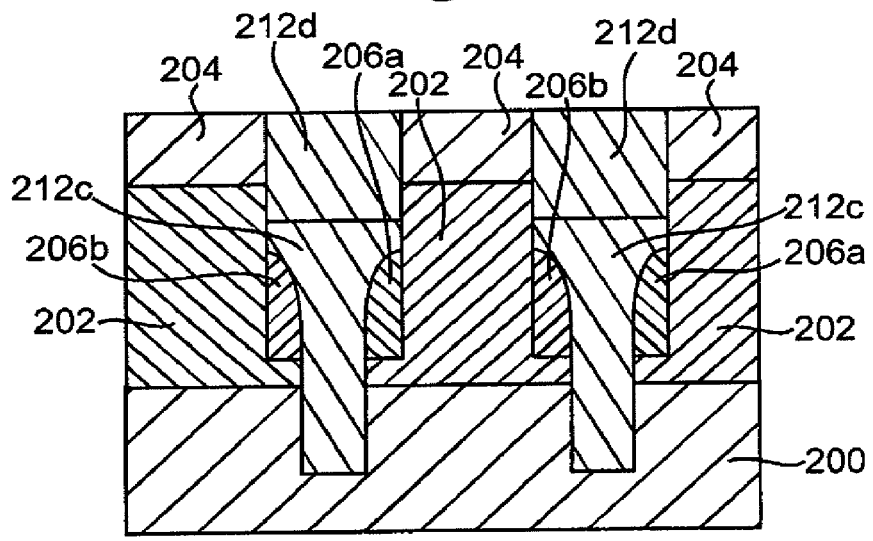
FIG. 28 illustrates a cross-sectional view of one embodiment of the collector regions, the base regions, emitter regions, buried word lines, and a second isolation material layer.

FIG. 28 illustrates a cross-sectional view of one embodiment of collector regions 200, base regions 202, buried word lines 206a-206b, emitter regions 204, first isolation material layer 212c, and a second isolation material layer 212d. Emitter portions 204b are etched to form emitter regions 204 as illustrated in FIG. 4. Isolation material, such as SiO$_2$, FSG, BPSG, BSG, low-k material, or other suitable dielectric material is deposited over exposed portions of emitter regions 204, base regions 202, and first isolation material layer 212c. The isolation material is deposited using CVD, HDP-CVD, ALD, MOCVD, PVD, JVP, or other suitable deposition technique. The isolation material is then planarized using CMP or another suitable planarization technique to expose emitter regions 204. First contacts 208, phase change elements 106, second contacts 210, and bit lines 112 are then fabricated to provide array of phase change memory cells 101 as previously described and illustrated with reference to FIGS. 2-4.

Embodiments of the present invention provide a phase change memory array including buried metallized word lines. The buried metallized word lines contact the sides of the base regions of vertically oriented bipolar transistors or diodes, which are used to access phase change memory elements. By using buried metallized word lines, the base doping can be optimized without constraint by the word line series resistance. In addition, the density of the array of phase change memory cells can be increased and more uniform operating conditions for the resistive elements at different positions along the word lines can be achieved. In addition, parasitic bipolar transistor actions between neighboring memory cells are effectively suppressed since the carrier recombination rate is significantly increased at the metallic word line, thus minimizing the minority carrier injection into the neighboring base region.

While the specific embodiments described herein substantially focused on using phase change memory elements, the present invention can be applied to any suitable type of resistive memory elements or resistivity changing elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
    a first vertical bipolar select device including a first base and a first emitter;
    a first phase change element coupled to the first emitter;
    a second vertical bipolar select device including a second base and a second emitter;
    a second phase change element coupled to the second emitter; and
    a buried word line contacting the first base and the second base.

2. The memory of claim 1, wherein the first vertical bipolar select device comprises a first diode, and wherein the second vertical bipolar select device comprises a second diode.

3. The memory of claim 1, wherein the first vertical bipolar select device comprises a first transistor including a first collector, and wherein the second vertical bipolar select device comprises a second transistor including a second collector.

4. The memory of claim 3, further comprising a substrate contacting the first collector and the second collector.

5. The memory of claim 1, further comprising a bit line coupled to the first phase change element and the second phase change element.

6. The memory of claim 1, further comprising:
    a first bit line coupled to the first phase change element; and
    a second bit line coupled to the second phase change element.

7. The memory of claim 1, further comprising shallow trench isolation between the first bipolar select device and the second bipolar select device.

* * * * *